(12) United States Patent
Li

(10) Patent No.: US 12,282,066 B2
(45) Date of Patent: Apr. 22, 2025

(54) BATTERY DIAGNOSIS SYSTEM, VEHICLE EQUIPPED WITH THE SAME, AND BATTERY DIAGNOSIS METHOD

(71) Applicant: TOYOTA JIDOSHA KABUSHIKI KAISHA, Toyota (JP)

(72) Inventor: Na Li, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 171 days.

(21) Appl. No.: 18/066,364

(22) Filed: Dec. 15, 2022

(65) Prior Publication Data

US 2023/0288484 A1 Sep. 14, 2023

(30) Foreign Application Priority Data

Mar. 14, 2022 (JP) .................................. 2022-039154
Jul. 21, 2022 (JP) .................................. 2022-116349

(51) Int. Cl.
    *G01R 31/3835* (2019.01)
    *B60L 58/10* (2019.01)
    *H01M 10/42* (2006.01)

(52) U.S. Cl.
    CPC .......... *G01R 31/3835* (2019.01); *B60L 58/10* (2019.02); *H01M 10/425* (2013.01); *H01M 10/4285* (2013.01); *H01M 2010/4278* (2013.01)

(58) Field of Classification Search
    CPC ................. G01R 31/3835; B60L 58/10; B60L 2240/547; B60L 2240/80; B60L 3/0046; B60L 3/12; H01M 10/425; H01M 10/4285; H01M 2010/4278; H01M 2220/20; H01M 10/48; Y02E 60/10
    See application file for complete search history.

(56) References Cited

U.S. PATENT DOCUMENTS

2019/0033397 A1* 1/2019 Karner .................. H02J 7/0047

FOREIGN PATENT DOCUMENTS

| JP | 2012055044 A | 3/2012 | |
|----|--------------|--------|---|
| JP | 2012174367 A | 9/2012 | |
| JP | 2012174487 A | 9/2012 | |
| JP | 2015195096 A | * 11/2015 | ............ H01M 10/42 |
| JP | 2021111584 A | 8/2021 | |
| JP | 2022076672 A | 5/2022 | |

* cited by examiner

*Primary Examiner* — Brian P Sweeney
(74) *Attorney, Agent, or Firm* — Dickinson Wright, PLLC

(57) ABSTRACT

A battery diagnosis system includes a sensor that measures a voltage of a secondary battery, and a processor configured to diagnose whether the secondary battery is a genuine product based on a voltage curve indicating a time change of a voltage measured by the sensor during a diagnosis target period. The diagnosis target period includes both a charging and discharging period and a charging and discharging pause period.

6 Claims, 12 Drawing Sheets

BATTERY DIAGNOSIS SYSTEM, VEHICLE EQUIPPED WITH THE SAME, AND BATTERY DIAGNOSIS METHOD

CROSS-REFERENCE TO RELATED APPLICATION

This application claims priority to Japanese Patent Application No. 2022-039154 filed on Mar. 14, 2022 and Japanese Patent Application No. 2022-116349 filed on Jul. 21, 2022, each incorporated herein by reference in its entirety.

BACKGROUND

1. Technical Field

The present disclosure relates to a battery diagnosis system, a vehicle equipped with the same, and a battery diagnosis method, and more specifically to a technique for diagnosing a secondary battery.

2. Description of Related Art

In recent years, a vehicle equipped with a battery pack has been more widespread. There is a possibility that a counterfeit product of the battery pack manufactured by a non-authorized manufacturer is distributed. Further, there is also a possibility that a battery pack of a genuine product is modified illegally. A non-genuine product, such as a counterfeit product and an illegally modified product may use an inferior secondary battery or have a control circuit having a defect. Therefore, a technique for diagnosing whether a battery pack is a genuine product has been proposed.

For example, a battery identification device disclosed in Japanese Unexamined Japanese Unexamined Patent Application Publication No. 2012-174367 (JP 2012-174367 A) monitors whether an assembled battery is a genuine product based on a first characteristic value and a second characteristic value. The first characteristic value is an output voltage value acquired from each of a plurality of battery cells when the traveling operation of the vehicle has ended or when charging to the assembled battery has ended. The second characteristic value is an output voltage value acquired from each of the battery cells when the traveling operation of the vehicle starts or when charging to an assembled battery starts.

SUMMARY

There is always a demand for a technique for diagnosing whether a secondary battery is a genuine product with high precision. The present disclosure is to diagnose whether or not the secondary battery is a genuine product with high precision.

A battery diagnosis system according to a first aspect of the present disclosure includes a sensor that measures a voltage of a secondary battery, and a processor configured to diagnose whether the secondary battery is a genuine product based on a voltage curve indicating a time change of a voltage measured by the sensor during a diagnosis target period. The diagnosis target period includes both a charging and discharging period and a charging and discharging pause period.

In the first aspect of the present disclosure, the processor may be configured to diagnose whether the secondary battery is a genuine product based on a comparison result between the voltage curve and a normal curve. The normal curve indicates a time change in a voltage of the genuine product during the diagnosis target period.

In the first aspect of the present disclosure, the processor may be configured to diagnose that the secondary battery is a genuine product, when a voltage on the voltage curve at a first timing during the charging and discharging period is within a first voltage range and a voltage on the voltage curve at a second timing during the charging and discharging pause period is within a second voltage range. The first voltage range and the second voltage range are determined based on the normal curve.

In the first aspect of the present disclosure, the processor may be configured to diagnose that the secondary battery is a genuine product, when a rate of change on the voltage curve at a first timing during the charging and discharging period is within a first reference range and a rate of change on the voltage curve at a second timing during the charging and discharging pause period is within a second reference range. The first reference range and the second reference range are determined based on the normal curve.

In a first aspect of the present disclosure, the processor may be configured to diagnose whether the secondary battery is a genuine product based on a comparison result between the voltage curve and the normal curve. The normal curve is generated by simulating noise interference.

In the first aspect of the present disclosure, the processor may be configured to diagnose whether the secondary battery is a genuine product, based on a plurality of comparison results between the voltage curve and the normal curve during the charging and discharging period and a plurality of comparison results between the voltage curve and the normal curve during the charging and discharging pause period.

In a first aspect of the present disclosure, the battery diagnosis system may further include a warning device configured to issue a warning, and the processor is configured to control the warning device to issue a warning when the secondary battery is diagnosed not as the genuine product.

A vehicle according to a second aspect of the present disclosure includes the battery diagnosis system.

A battery diagnosis method according to a third aspect of the present disclosure includes; acquiring, by a computer, a voltage curve indicating a time change of a voltage of a secondary battery measured by a sensor during a diagnosis target period, and diagnosing by the computer, whether the secondary battery is a genuine product based on the voltage curve. The diagnosis target period includes both a charging and discharging period and a charging and discharging pause period.

According to the aspect of the present disclosure, it is possible to diagnose whether the secondary battery is a genuine product with high precision.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

Figure 1:
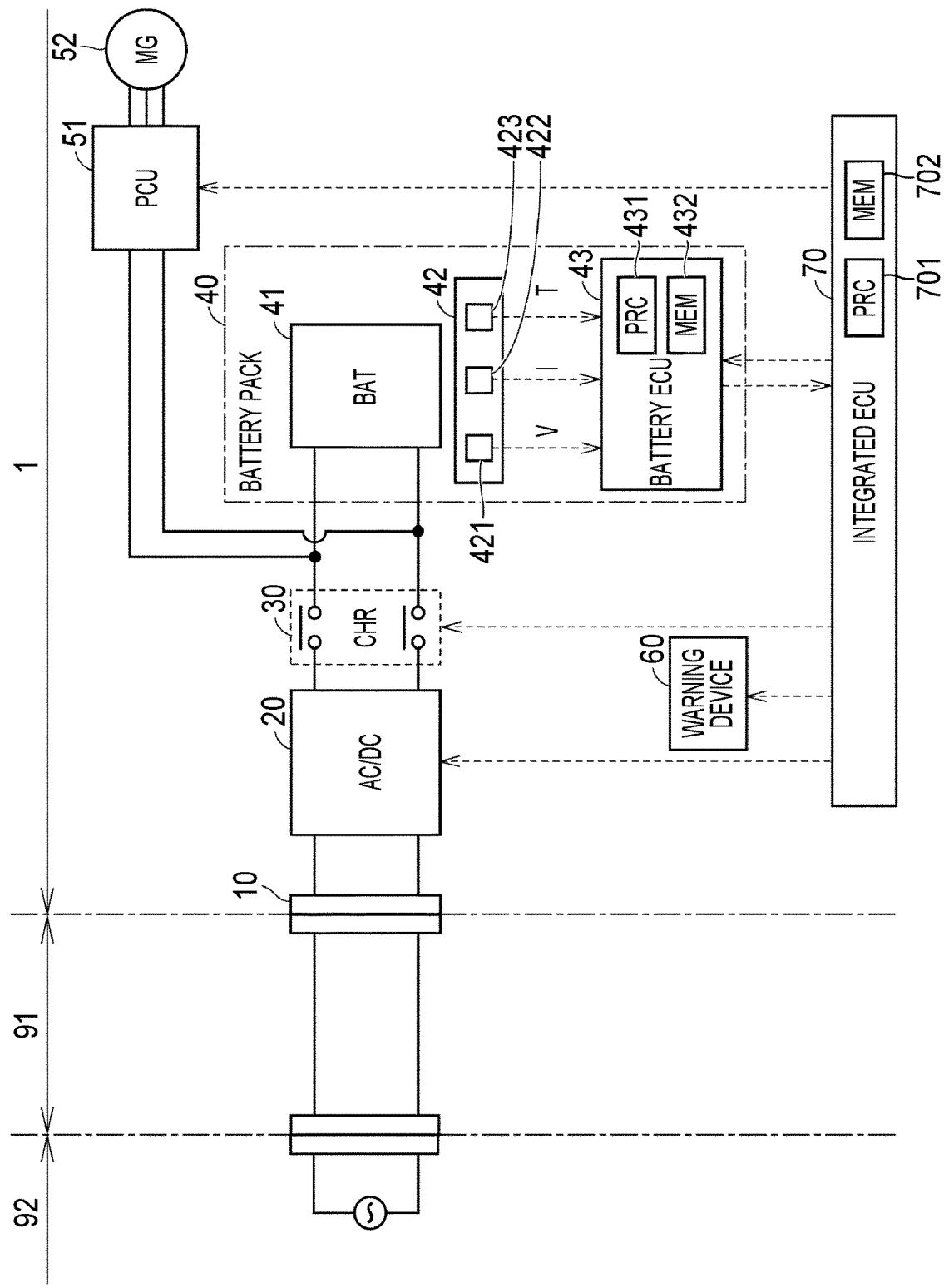
FIG. 1 is a diagram schematically showing an overall configuration of a vehicle equipped with a battery diagnosis system according to Embodiment 1.

Hereinafter, embodiments of the present disclosure will be described in detail with reference to the drawings. The same or corresponding parts in the drawings are designated by the same reference numerals, and the description thereof will not be repeated.

In the following embodiments, an example in which a battery diagnosis system according to the present disclosure is equipped in a vehicle will be described. However, the application of the battery diagnosis system according to the present disclosure is not limited to the vehicle, and may be to the stationary, for example.

Embodiment 1

System Configuration

FIG. 1 is a diagram schematically showing an overall configuration of a vehicle equipped with a battery diagnosis system according to Embodiment 1. A vehicle 1 is, for example, a battery electric vehicle (BEV) in the present embodiment. Note that, the kind of the vehicle 1 is not limited thereto as long as the vehicle is equipped with a battery pack. The vehicle 1 may be a hybrid electric vehicle (HEV), may be a plug-in hybrid electric vehicle (PHEV), or may be a fuel cell electric vehicle (FCEV).

The vehicle 1 includes an inlet 10, an alternating current to direct current converter (AC/DC converter) 20, a charge relay (CHR) 30, a battery pack 40, a power control unit (PCU) 51, and a motor generator (MG) 52, a warning device 60, and an integrated electronic control unit (ECU) 70. The battery pack 40 includes a battery 41, a monitoring unit 42, and a battery ECU 43.

The inlet 10 is configured such that a charging connector provided at the tip of a charging cable 91 can be inserted. The vehicle 1 and a charging device 92 installed outside the vehicle 1 are electrically connected via the charging cable 91. As a result, the battery 41 is charged using the electric power supplied from the charging device 92 (plug-in charging).

The alternating current to direct current converter 20 is electrically connected between the inlet 10 and the charge relay 30. The alternating current to direct current converter 20 converts alternating current power supplied from the charging device 92 via the inlet 10 into direct current power, and outputs the direct current power to the charge relay 30. Further, the alternating current to direct current converter 20 converts direct current power supplied from the battery 41 (or the PCU 51) via the charge relay 30 into alternating current power, and outputs the alternating current power to the inlet 10. The charge relay 30 is electrically connected to an electric power line connecting the alternating current to direct current converter 20 and the battery 41. The charge relay 30 is opened or closed according to a control signal from the integrated ECU 70.

The battery 41 stores electric power for driving the motor generator 52 and supplies the electric power to the motor generator 52 through the PCU 51. Further, the battery 41 is charged with electric power output from the alternating current to direct current converter 20 during plug-in charging. Furthermore, the battery 41 is charged by receiving generated electric power through the PCU 51 also during the power generation of the motor generator 52 (during regenerative power generation, and the like).

The monitoring unit 42 includes a voltage sensor 421, a current sensor 422 and a temperature sensor 423. The voltage sensor 421 detects a voltage V of the battery 41 (more specifically, each cell). The current sensor 422 detects a current I input and output to and from the battery 41. The temperature sensor 423 detects a temperature T of the battery 41 (specifically, a specific cell). Each sensor outputs a signal indicating the detection result to the battery ECU 43. The voltage sensor 421 is an example of a "sensor" according to the present disclosure.

The battery ECU 43 includes a processor 431 such as a central processing unit (CPU), a memory 432 such as a read only memory (ROM) and a random access memory (RAM), and an input and output port that inputs and outputs various signals (not shown). The battery ECU 43 manages the battery 41 in cooperation with the integrated ECU 70 based on input of a signal from each sensor of the monitoring unit 42 and a map and a program stored in the memory 432. In the present embodiment, main processing executed by battery ECU 43 may include "battery diagnosis processing" for diagnosing whether the battery 41 is a genuine product. The battery diagnosis processing by the battery ECU 43 will be described later.

The PCU 51 includes, for example, an inverter and a converter (both not shown). The PCU 51 executes bidirectional electric power conversion between the battery 41 and the motor generator 52 in accordance with a control signal from the integrated ECU 70.

The motor generator 52 is, for example, a three-phase alternating current rotary electric machine in which permanent magnets are embedded in a rotor (not shown). The motor generator 52 rotates a drive shaft by using supply electric power from the battery 41. Further, the motor generator 52 can generate power by regenerative braking. The alternating current power generated by motor generator 52 is converted into direct current power by the PCU 51, and the battery 41 is charged with the direct current power.

The warning device 60 is, for example, a warning light that is lit on an instrument panel. The warning device 60 may be a navigation system display capable of displaying a warning message, or may be a speaker capable of generating a warning sound.

The integrated ECU 70 includes a processor 701, a memory 702, and an input and output port (not shown), in the same manner as the battery ECU 43. The integrated ECU 70 controls apparatuses (the alternating current to direct current converter 20, the charge relay 30, and the PCU 51) such that the vehicle 1 is in a desired state, based on input of a signal from each sensor provided in the vehicle 1 and a map and a program stored in the memory. The integrated ECU 70, for example, controls charging and discharging of the battery 41 by controlling the alternating current to direct current converter 20 and/or the PCU 51.

The integrated ECU 70 instead of the battery ECU 43 may execute the battery diagnosis processing. Further, the battery ECU 43 may execute a portion of the battery diagnosis processing, and the integrated ECU 70 may execute the rest of the processing. One or both of the processor 431 of the battery ECU 43 and the processor 701 of the integrated ECU 70 are examples of the "processor" according to the present disclosure.

Battery Configuration

Figure 2:
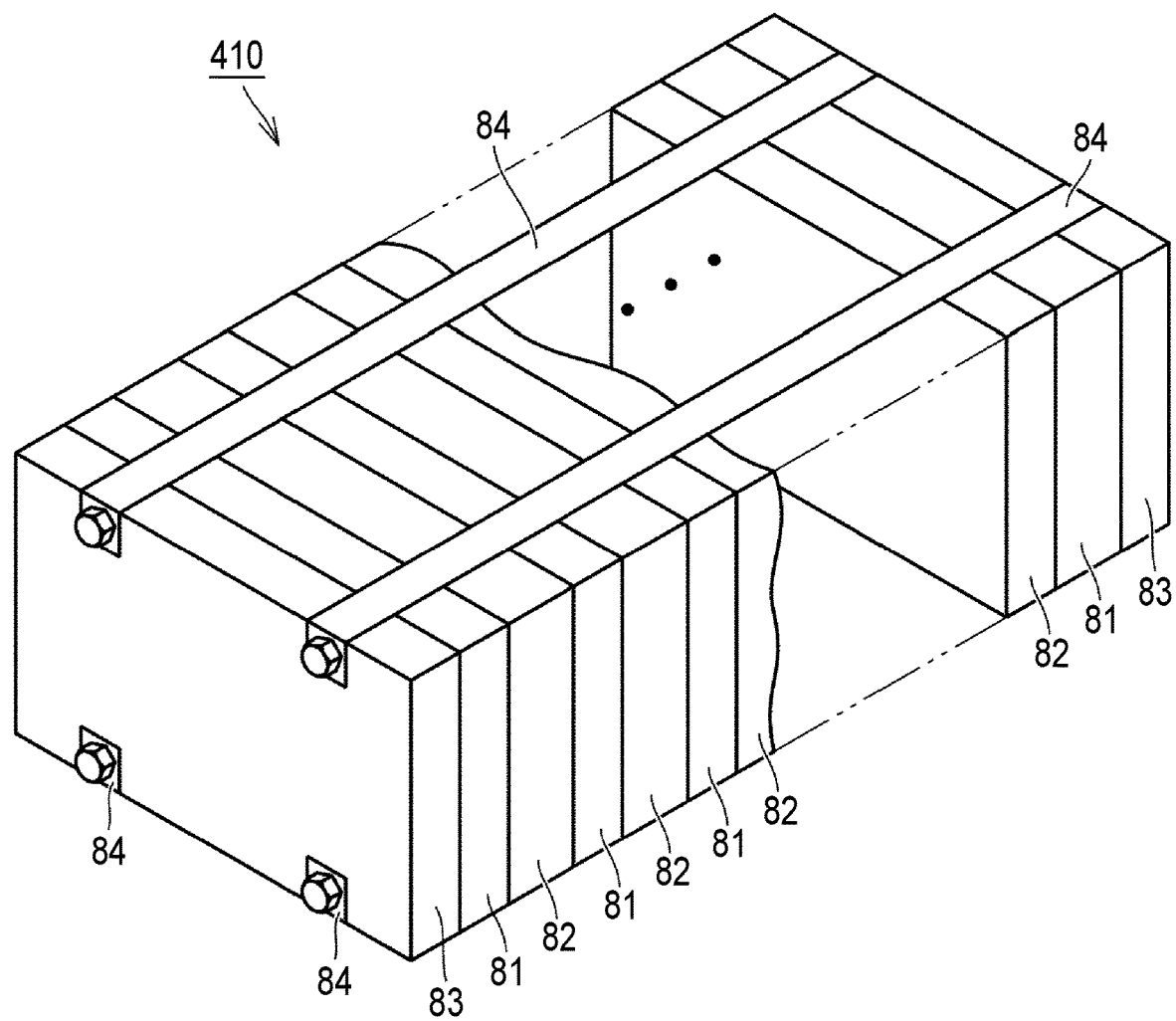
FIG. 2 is a perspective view schematically showing a structure of a battery.

FIG. 2 is a perspective view schematically showing a structure of the battery 41. The battery 41 is an assembled battery that includes a plurality of stacks 410 (also called a module or a block). The stacks 410 may be connected in series or may be connected in parallel with each other. One of the stacks 410 is representatively shown in FIG. 1.

The stack 410 includes a plurality of cells 81, a plurality of resin frames 82, a pair of end plates 83, and a pair of restraint bands 84. In the stack 410, a stacked body is formed by stacking the cells 81 and the resin frames 82. Hereinafter, the height direction of the stacked body is indicated as HG, the length direction (stacking direction) of the stacked body is indicated as LN, and the width direction of the stacked body is indicated as WD.

Each of the cells 81 is a lithium ion battery in the present embodiment. However, each of the cells 81 may be another secondary battery, such as a nickel-metal hydride battery. The number of cells included in the stack 410 is not particularly limited. Each of the cells 81 has a common configuration. The configuration of the cell 81 will be described with reference to FIG. 3.

Each of the resin frames 82 is disposed between the two cells 81 adjacent in the stacking direction. A pair of end plates 83 is disposed at a first end and a second end in the stacking direction of the stacked body. That is, the end plates 83 are disposed to sandwich the stacked body from both sides in the stacking direction. A pair of restraint bands 84 is disposed on the upper surface and the lower surface of the resin frame 82. The restraint band 84 mutually restrains the end plates 83 in a state of sandwiching the stacked body.

Figure 3:
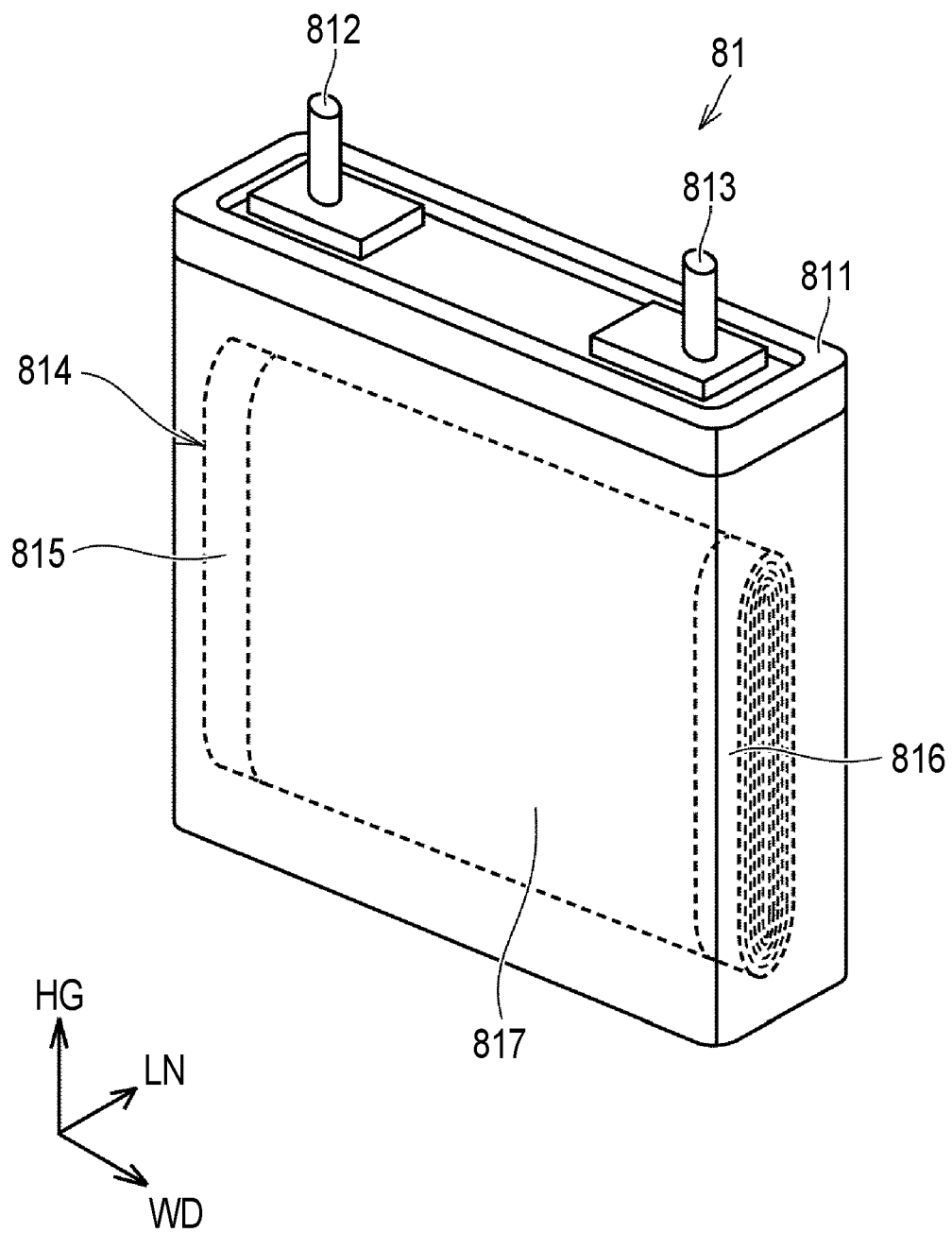
FIG. 3 is a see-through perspective view showing an example of a configuration of a cell.

FIG. 3 is a see-through perspective view showing an example of the configuration of the cell 81. As previously mentioned, in the example, the cell 81 is a lithium ion battery.

The cell 81 is a prismatic cell having a substantially rectangular parallelepiped shape. The upper surface of the case of the cell 81 is sealed with a lid 811. A positive electrode terminal 812 and a negative electrode terminal 813 are provided on the lid 811. A first end of each of the positive electrode terminal 812 and the negative electrode terminal 813 protrudes outside from the lid 811. A second end of each of the positive electrode terminal 812 and the negative electrode terminal 813 is electrically connected to an internal positive electrode terminal and an internal negative electrode terminal (both not shown) inside the case, respectively. Although not shown, the two adjacent cells 81 are electrically connected to each other by a bus bar.

An electrode body 814 is housed inside the case. The electrode body 814 is formed by, for example, stacking the positive electrode 815 and the negative electrode 816 with a separator 817 interposed therebetween and winding the stack into a cylindrical shape. An electrolyte is held by the positive electrode 815, the negative electrode 816, the separator 817, and the like. It is also possible to adopt a stacked body as the electrode body 814 instead of the wound body.

The positive electrode 815, the negative electrode 816, the separator 817, and the electrolyte can use known configurations and materials in related art for the positive electrode, the negative electrode, the separator, and the electrolyte of a lithium ion secondary battery. As an example, the positive electrode 815 includes $LiNi_{1/3}Co_{1/3}Mn_{1/3}O_2$ (NCM), which is a positive electrode mixture, and aluminum (Al) foil, which is a positive electrode foil. The negative electrode 816 includes graphite (C), which is a negative electrode mixture, and copper (Cu) foil, which is a negative electrode foil. Polyolefin (for example, polyethylene and polypropylene) can be used for the separator. The electrolyte includes an organic solvent (for example, a mixed solvent of dimethylcarbonate (DMC), ethylmethylcarbonate (EMC), and ethylenecarbonate (EC)), a lithium salt (for example, $LiPF_6$), and an additive (for example, lithiumbis(oxalate) borate (Li-BOB) or $Li[PF_2(C_2O_4)_2]$).

Voltage Change Curve

In the vehicle 1 configured as described above, the battery 41 deteriorates as the battery 41 is used or as time elapses. When the deterioration of the battery 41 has progressed to a considerable extent, it is conceivable to replace the battery 41 with a new battery (or a used battery of which the deterioration has not progressed). At that time, there is a possibility that the battery will be replaced with a battery of a non-genuine product, such as a counterfeit product or an illegally modified product. When the battery is replaced with a battery of a non-genuine product, various performances of the vehicle 1 may deteriorate. Therefore, it is needed to diagnose whether the battery 41 is a genuine product with high precision.

Therefore, in the present embodiment, diagnosis is made on whether the battery 41 is a genuine product by using a "voltage change curve" measured during a specific period described below. The period is described as a "diagnosis target period". As described above, since the configurations of the cells 81 are the same, the voltage of any of the cells 81 may be measured to acquire the voltage change curve. In the following description, the voltage change curve of the battery 41 will be used without distinguishing the cells for the sake of simplicity.

Diagnosis Target Period

Figure 4:
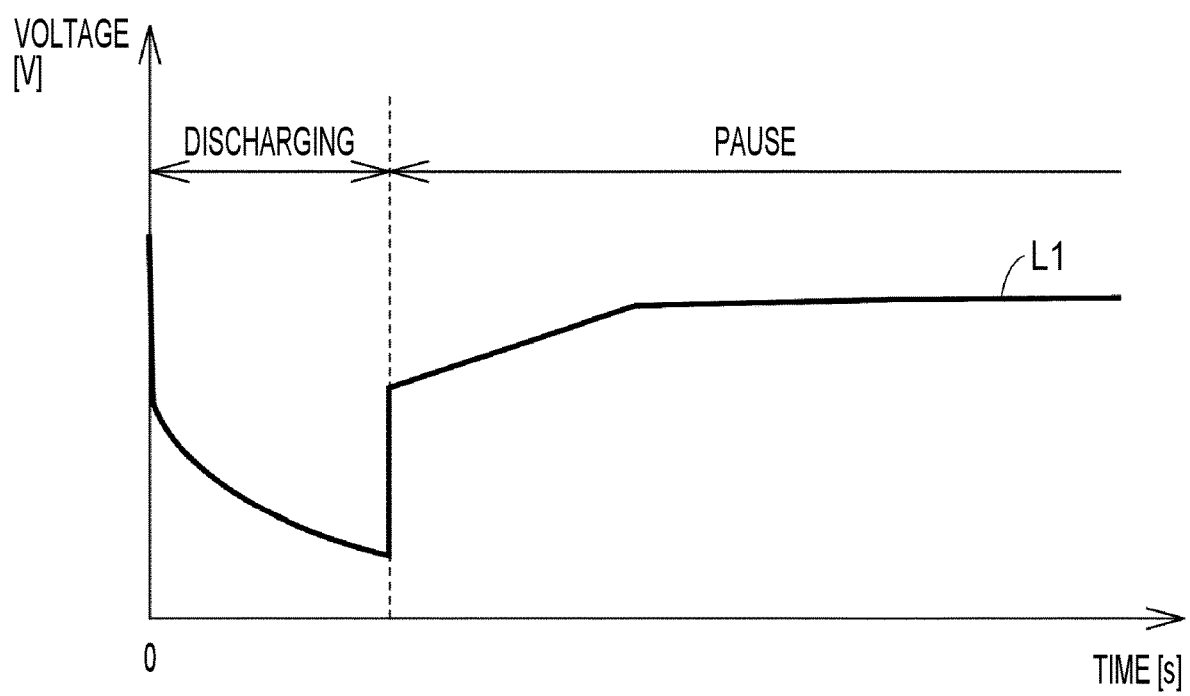
FIG. 4 is a graph showing a first example of a diagnosis target period.
Figure 5:
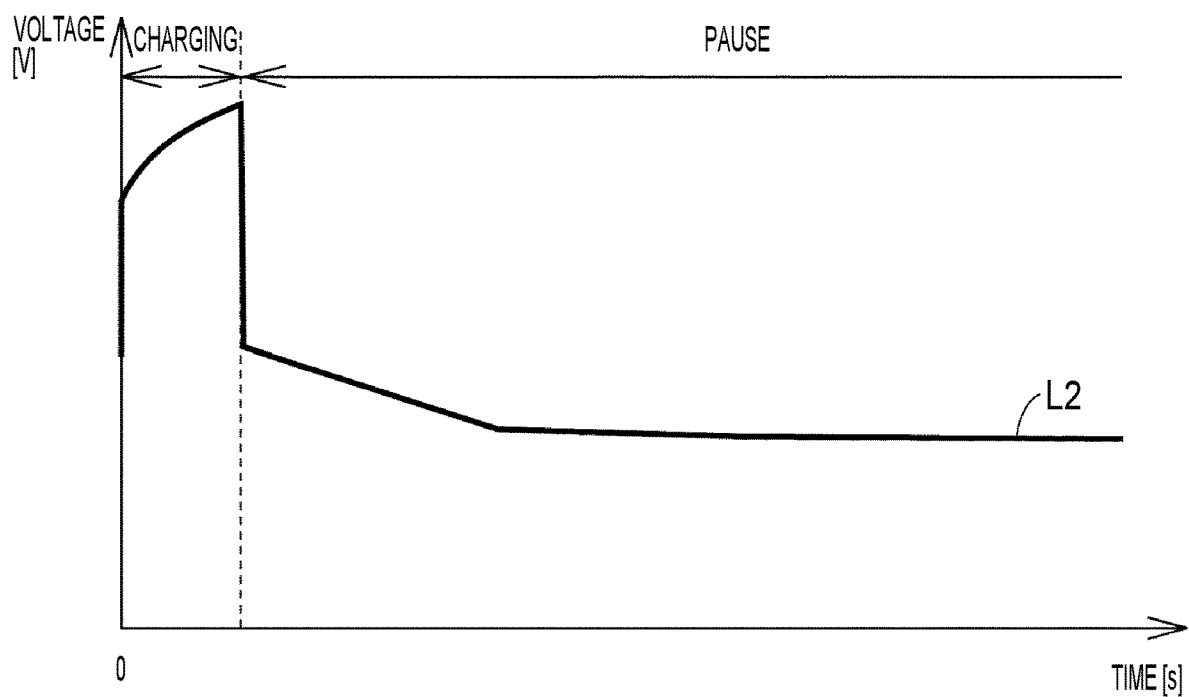
FIG. 5 is a graph showing a second example of the diagnosis target period.

FIG. 4 is a graph showing a first example of a diagnosis target period. FIG. 5 is a graph showing a second example of the diagnosis target period. In FIGS. 4 and 5, the horizontal axis represents elapsed time. The vertical axis represents the voltage V measured by the voltage sensor 421. The same applies to FIGS. 6, 7, 10, 13, and 14, which will be described later.

As shown in FIG. 4, the diagnosis target period includes a discharging period during which the battery 41 is discharged and a pause period during which the charging and discharging of the battery 41 is stopped. The length of the discharging period may range from several seconds to tens of seconds. The length of the pause period may be several tens of seconds. For example, when the vehicle 1 travels uphill and then stops for a certain period of time for waiting for a traffic light, a voltage change curve L1 as shown in FIG. 4 is measured.

Alternatively, as shown in FIG. 5, the diagnosis target period may include a charging period during which the battery 41 is charged and a pause period during which the charging and discharging of the battery 41 is paused. The length of the charging period may be from several seconds to tens of seconds. The length of the pause period may be several tens of seconds. For example, when the vehicle 1 travels downhill and then stops for a certain period of time for waiting for a traffic light, a voltage change curve L2 as shown in FIG. 5 is measured. The similar voltage change curve L2 can be measured by pausing charging even during plug-in charging of the vehicle 1.

The voltage change curve L1 or L2 measured during the diagnosis target period is stored in the memory 432 of the battery ECU 43. Then, the voltage change curve L1 or L2 is compared with a voltage curve acquired in advance from a genuine product of the battery 41. Hereinafter, the voltage change curve of the genuine product is also abbreviated as the "normal curve".

Figure 6:
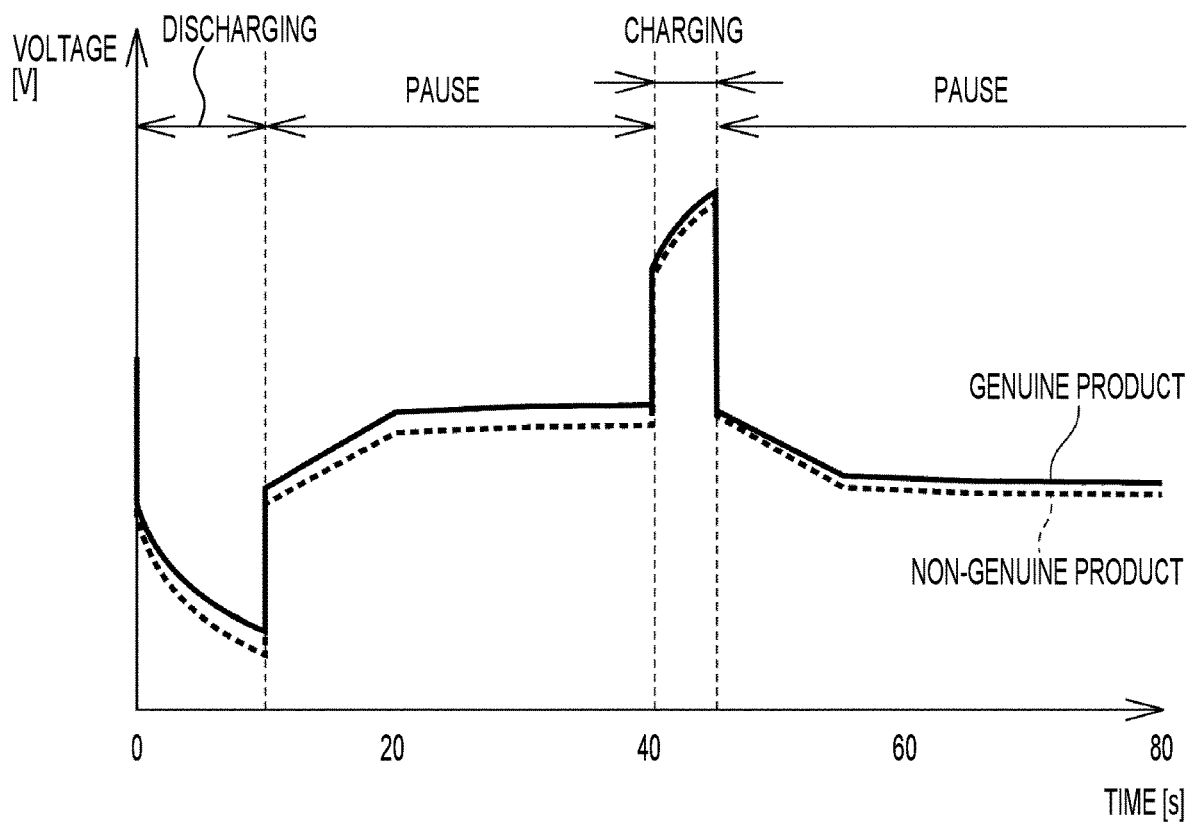
FIG. 6 is a graph showing a voltage change curve of a genuine product and a voltage change curve of a non-genuine product.

FIG. 6 is a graph showing a normal curve and a voltage change curve of a non-genuine product. As shown in FIG. 6, the shape of the voltage change curve differs between the genuine product and the non-genuine product of the battery 41. Therefore, by comparing the voltage change curve L1 (or L2) with the normal curve, it is possible to diagnose whether the battery 41 is a genuine product or a non-genuine product. That is, when the voltage change curve L1 matches the normal curve, the battery 41 can be diagnosed as a genuine product. On the other hand, when the voltage change curve L1 does not match the normal curve, the battery 41 can be diagnosed as a non-genuine product.

It is desirable to prepare a normal curve for each combination of SOC and a current I. For example, a large number of normal curves are prepared by measuring voltage changes under conditions in which SOC in the initial condition differs by a predetermined amount and the current I differs by a predetermined value. A large number of normal curves are stored in the memory 432 of the battery ECU 43 in the example. The battery ECU 43 selects a normal curve to be compared with voltage change curve L1 according to the combination of SOC and the current I.

Figure 7:
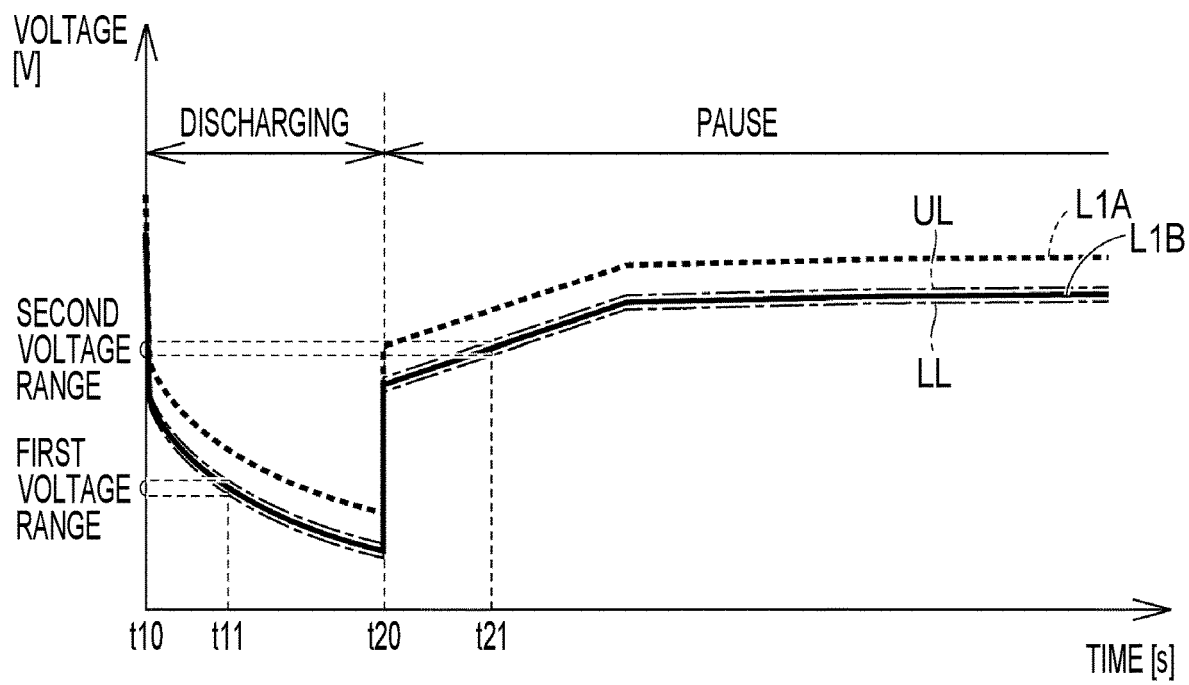
FIG. 7 is a graph for illustrating a method for diagnosing the genuine product of the battery in Embodiment 1.

FIG. 7 is a graph for illustrating a method for diagnosing a genuine product of the battery 41 according to Embodiment 1. In FIG. 7, the voltage change curve L1 shown in FIG. 4 is described as an example, but the diagnosis can be made similarly using the voltage change curve L2 shown in FIG. 5.

Even in a genuine product, a certain degree of voltage variation may occur. Therefore, a voltage range VR including a normal curve is preset. The upper voltage limit of the voltage range VR is indicated by UL, and the lower voltage limit thereof is indicated by LL. In Embodiment 1, determination is made on whether the voltage change curve L1 is within the voltage range VR. More specifically, at least one voltage during the discharging period and at least one voltage during the pause period are used.

In the example shown in FIG. 7, determination is made on whether the voltage V (t11) at time t11 (an example of the "first timing" according to the present disclosure) during the discharging period is within a first voltage range from an upper limit voltage UL to a lower limit voltage LL, and determination is made on whether the voltage V (t21) at time t21 (an example of the "second timing" according to the present disclosure) during the pause period is within a second voltage range from the upper limit voltage UL to the lower limit voltage LL.

For a certain voltage change curve L1A, the voltage V (t11) exceeds the upper limit voltage UL of the first voltage range, and the voltage V (t21) exceeds the upper limit voltage UL of the second voltage range. In this case, the battery 41 is diagnosed as a non-genuine product from the voltage change curve L1A. On the other hand, for the other voltage change curve L1B, the voltage V (t11) is within the first voltage range and the voltage V (t21) is within the second voltage range. In this case, the battery 41 is diagnosed as a genuine product from the voltage change curve L1B.

For ease of understanding, an example has been described in which diagnosis is executed based on one voltage value during the discharging period and one voltage value during the pause period. However, the diagnosis may be executed based on a plurality of voltage values during the discharging period and a plurality of voltage values during the pause period. Diagnosis precision can be improved by executing the diagnosis based on a plurality of voltage values.

Impedance Component of Internal Resistance

In the present embodiment, both the voltage value during the discharging period and the voltage value during the pause period are used. The reason will be described.

Figure 8:
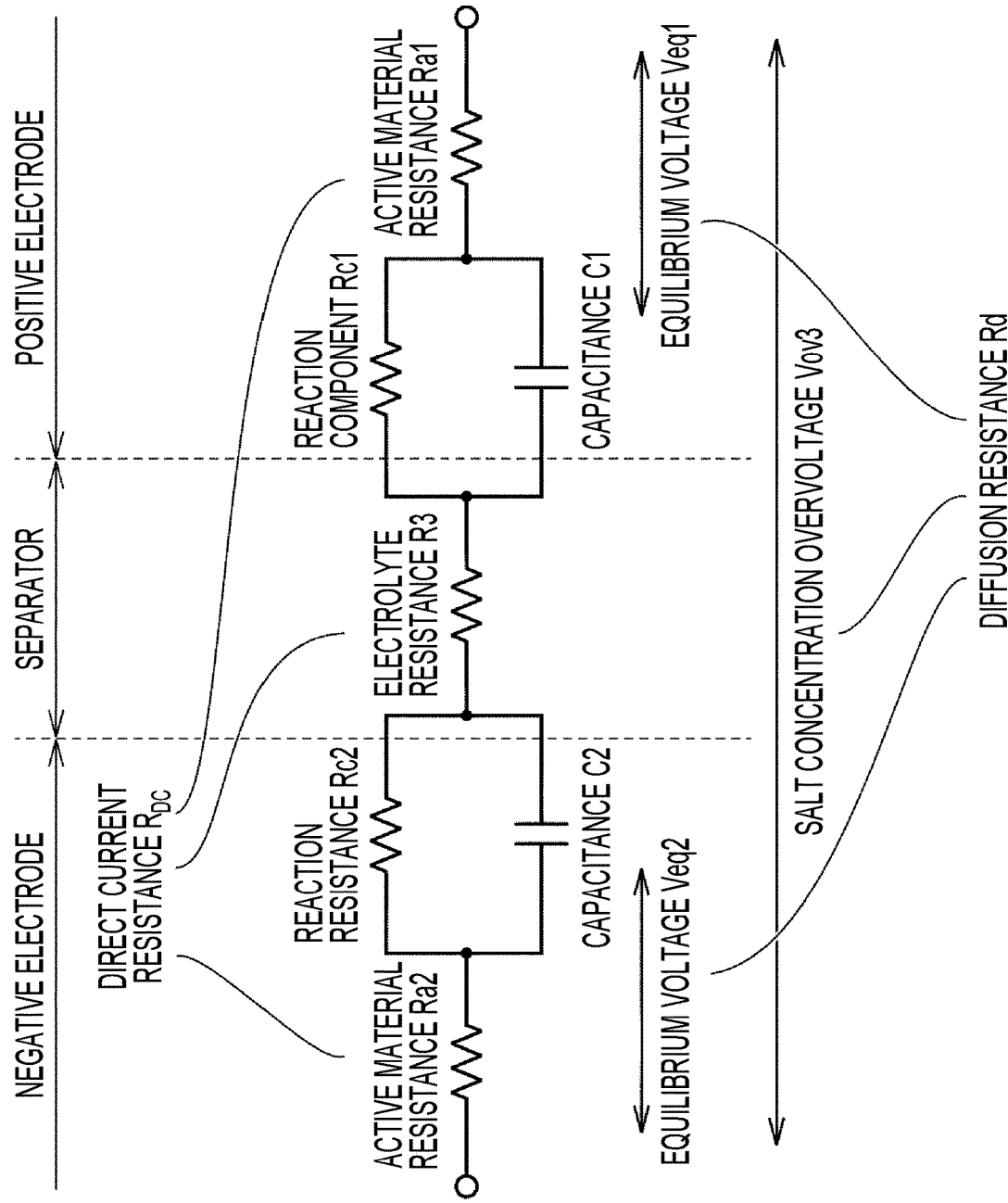
FIG. 8 is a diagram for illustrating an impedance component of an internal resistance of the battery.

FIG. 8 is a diagram for illustrating an impedance component of an internal resistance of the battery 41. FIG. 8 shows an example of an equivalent circuit diagram of the positive electrode, the negative electrode, and the separator of the battery 41 (each of the cells 81). The impedance component of the battery 41 can be classified into a direct current resistance $R_{DC}$, a reaction resistance Rc, and a diffusion resistance Rd.

The direct current resistance $R_{DC}$ is the impedance component associated with the movement of lithium ions and electrons between the positive electrode and the negative electrode. The direct current resistance $R_{DC}$ increases due to deviations in the salt concentration distribution of the electrolyte, and the like when a high load is applied to the battery 41 (when a high voltage is applied or a large current flows). The direct current resistance $R_{DC}$ is represented in the equivalent circuit diagram as an active material resistance Ra1 of the positive electrode, an active material resistance Ra2 of the negative electrode, and an electrolyte resistance R3 of the separator.

The reaction resistance Rc is an impedance component associated with the delivering and receiving of electric charges (electric charge transfer) at the interface between the electrolyte and the active material (the surface of the positive electrode active material and the negative electrode active material). The reaction resistance Rc increases due to, the growth of a film on the active material-electrolyte interface, and the like when the battery 41 in a high-SOC state is in a high-temperature environment. The reaction resistance Rc is represented in the equivalent circuit diagram as a resistance component Rc1 of a positive electrode and a resistance component Rc2 of a negative electrode.

A diffusion resistance Rd is an impedance component associated with diffusion of salt in an electrolyte or an electric charge transport material in an active material. The diffusion resistance Rd increases due to cracking of the active material when a high load is applied, and the like. The diffusion resistance Rd is determined by an equilibrium voltage Veq1 generated at the positive electrode, an equilibrium voltage Veq2 generated at the negative electrode, and a salt concentration overvoltage Vov3 generated in the cell (overvoltage caused by the occurrence of the salt concentration distribution of the active material in the separator).

The following relational equation (1) holds among the voltage V (closed circuit voltage (CCV)) measured by voltage sensor 421, an open circuit voltage (OCV), the current I, the impedance components $R_{DC}$, Rc, Rd, and a polarization voltage $\Delta Vp$. $V=OCV-I\times(R_{DC}+Rc+Rd)-\Delta Vp$ ... (1)

As described above, the voltage change curve L1 and the normal curve having the same combination of SOC and the current I are compared. Further, there is a correspondence relationship between SOC and the OCV. Therefore, approximation may be made that the difference between OCV and the current I in Equation (1) is sufficiently small between the voltage change curve L1 and the normal curve.

The voltage V measured during the discharging period reflects the impedance components $R_{DC}$, Rc, Rd and the polarization voltage $\Delta Vp$. During the discharging period, the voltage drop amount due to each of the impedance components $R_{DC}$, Rc, Rd is significantly larger than the polarization voltage $\Delta Vp$. Therefore, comparing the voltage V (t11) measured during the discharging period with the corresponding voltage (first voltage range) on the normal curve is an example of mainly comparing each of the impedance components $R_{DC}$, Rc, Rd between the battery 41 to be diagnosed and the genuine product.

On the other hand, since I=0 during the pause period, the polarization voltage $\Delta Vp$ is reflected in the voltage V measured during the pause period. Therefore, by comparing the voltage V (t21) measured during the pause period with the corresponding voltage (second voltage range) on the normal curve is an example of comparing the polarization voltage $\Delta Vp$ between the battery 41 to be diagnosed and the genuine product.

The genuine product and the non-genuine product have different specifications, and the resistances $R_{DC}$, Rc, Rd and the polarization voltage $\Delta Vp$ are also different. Therefore, by comparing the voltage V on the voltage change curve measured during the discharging period with the corresponding voltage on the normal curve, diagnosis can be made on whether the battery 41 is a genuine product. In particular, by comparing both the resistances $R_{DC}$, Rc, Rd and the polarization voltage $\Delta Vp$, diagnosis can be made with high precision on whether the battery 41 to be diagnosed is a genuine product.

Battery Diagnosis Flow

Figure 9:
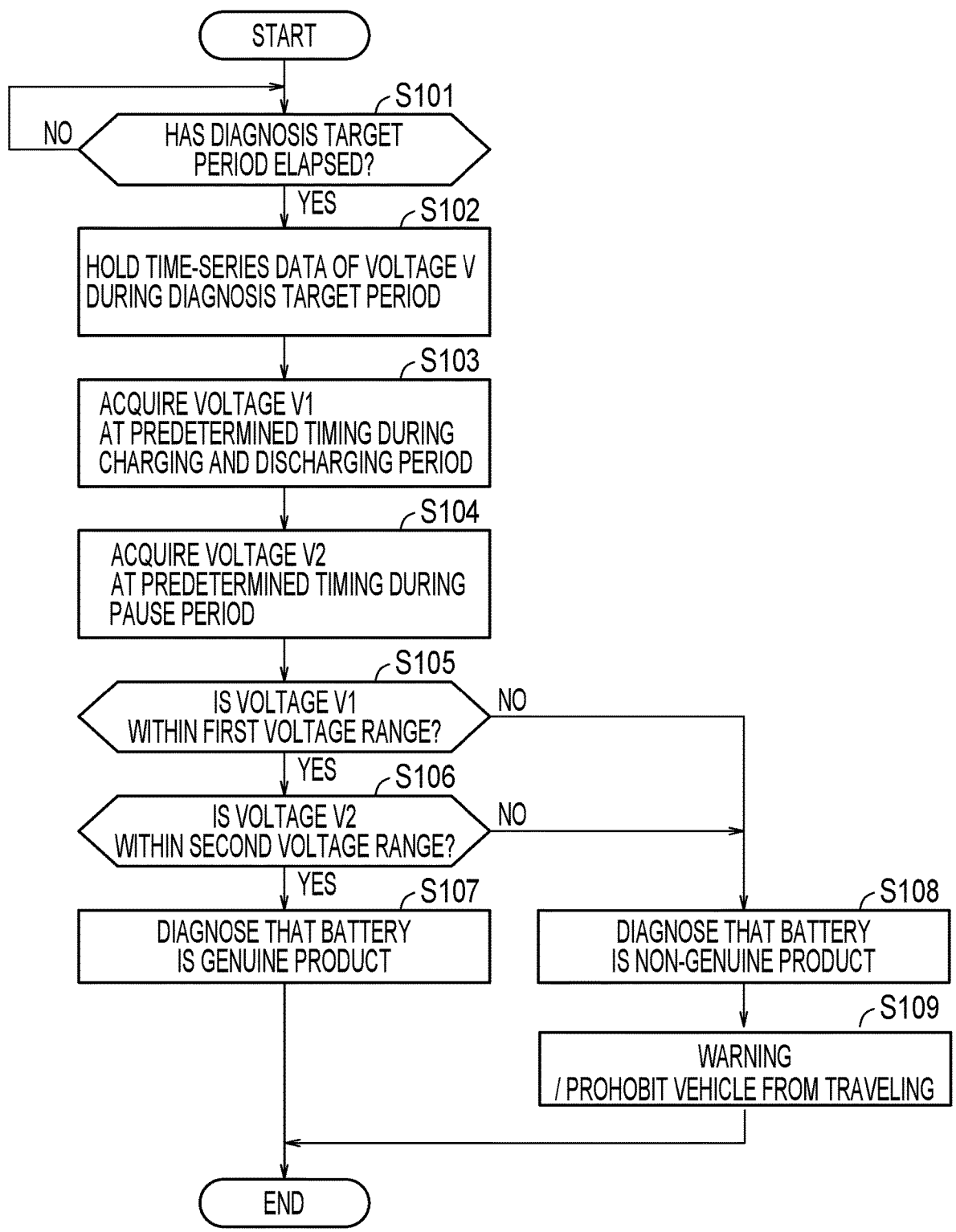
FIG. 9 is a flowchart showing battery diagnosis processing according to Embodiment 1.

FIG. 9 is a flowchart showing battery diagnosis processing according to Embodiment 1. The flowchart is invoked and executed from a main routine (not shown) when a predetermined condition is satisfied (for example, when the battery pack 40 is replaced). Each step is realized by software processing by the battery ECU 43, but may be realized by hardware (electric circuit) produced in the battery ECU 43. Hereinafter, step is abbreviated as S.

In the flowchart, any one stack 410 among the stacks 410 included in the battery 41 is a diagnosis target. Two or more of the stacks 410 can also be diagnosed by executing the same processing on the stacks 410 other than the relevant stack.

In S101, the battery ECU 43 determines whether the diagnosis target period described in FIG. 4 or 5 (for example, the discharging period of several seconds to several tens of seconds followed by the pause period of several tens of seconds) has elapsed. The battery ECU 43 sequentially acquires the voltage V from the voltage sensor 421 and temporarily stores the acquired voltage V (that is, time-series data of the voltage V) in the memory 432. When the diagnosis target period has not elapsed (NO in S101), the battery ECU 43 continues to temporarily store the voltage V. In this case, an exact portion of old time-series data of the voltage V that exceeds a predetermined storage capacity is erased from the memory 432. On the other hand, when the diagnosis target period has elapsed (YES in S101), the battery ECU 43 holds the time-series data of voltage V during the diagnosis target period without erasing the time-series data (S102).

In S103, the battery ECU 43 acquires a voltage V1 at a predetermined timing during the charging and discharging period (during the charging period or during the discharging period) from the held time-series data (voltage change curve) of the voltage V. In the example of FIG. 7, the voltage V (t11) at time t11 is an example of the voltage V1. The predetermined timing here can be determined, for example, based on a result of a previous experiment, such as a time when X seconds have elapsed from the charging and discharging start time t10.

In S104, the battery ECU 43 acquires a voltage V2 at a predetermined timing during the pause period from the time-series data of the held voltage V. In the example of FIG. 7, the voltage V (t21) at time t21 is an example of the voltage V2. The predetermined timing here can be determined, for example, as a time when Y seconds have elapsed since pause start time (charging and discharging stop time) t20. Y may be the same as X or may be different.

In S105, the battery ECU 43 determines whether the voltage V1 is within the first voltage range. Further, in S106, the battery ECU 43 determines whether the voltage V2 is within the second voltage range. As mentioned above, the normal curve is selected according to the combination of SOC and the current I. Therefore, both the first voltage range and the second voltage range can change according to the combination of SOC and current I.

When the voltage V1 is within the first voltage range and the voltage V2 is within the second voltage range (YES in S105 and YES in S106), the battery ECU 43 diagnoses that battery 41 is a genuine product (S107).

On the other hand, when the voltage V1 is not within the first voltage range (NO in S105) or when the voltage V2 is not within the second voltage range (NO in S106), the battery ECU 43 diagnoses that the battery 41 is a non-genuine product (S108). In this case, the battery ECU 43 operates in cooperation with the integrated ECU 70 to control the warning device 60 such that the warning light is turned on, the warning message is displayed, and the warning sound is generated (S109). The battery ECU 43 may prohibit the vehicle 1 from traveling by operating in cooperation with the integrated ECU 70.

As described above, in Embodiment 1, diagnosis is made on whether the battery 41 is a genuine product based on the voltage value of the voltage change curve (time-series data of the voltage V) measured by voltage sensor 421 during the diagnosis target period including both the charging and discharging period and the pause period. Since diagnosis is made based on the voltage in both the charging and discharging period and the pause period, the difference in specifications of the battery 41 can be accurately detected. Therefore, according to Embodiment 1, diagnosis can be made with high precision whether the battery 41 is a genuine product.

In the same manner as the illustration in FIG. 7, also in the flowchart shown in FIG. 9, diagnosis of a genuine product and a non-genuine product may be executed based on a plurality of voltage V1 measured during the charging and discharging period and a plurality of voltage V2 measured during the pause period. In this case, when the ratio of the voltages V1 and V2 within the voltage range (within the first voltage range or within the second voltage range) is equal to or greater than a predetermined value, the battery 41 may be diagnosed as a genuine product, and when the ratio is less than a predetermined value, the battery 41 is diagnosed as a non-genuine product. Diagnosis precision can be further improved by diagnosing based on the plurality of voltages V1 and V2.

Embodiment 2

Embodiment 1 has described an example in which diagnosis is executed based on the voltage value on the voltage change curve. In Embodiment 2, an example will be described in which diagnosis is executed based on the rate of change in the voltage change curve (in other words, the slope of the tangent line drawn on the voltage change curve). The configuration of the vehicle according to Embodiment 2 is the same as the configuration of the vehicle 1 according to Embodiment 1 (see FIGS. 1 to 3), and thus description thereof will not be repeated.

Figure 10:
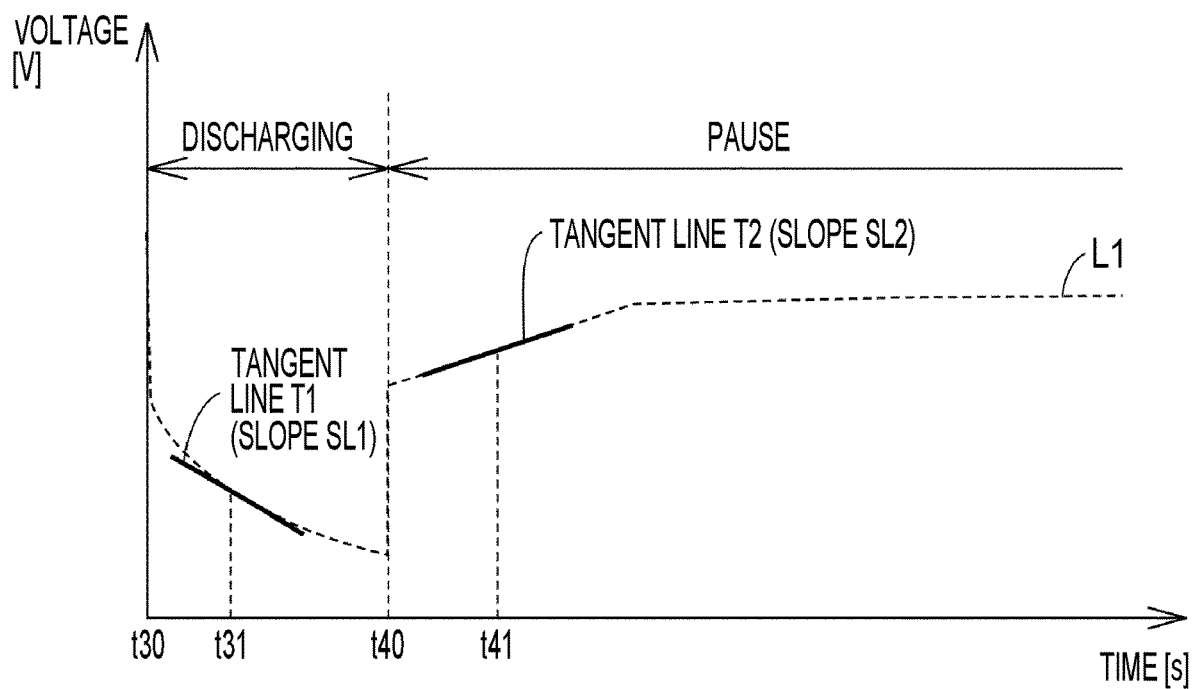
FIG. 10 is a graph for illustrating a method for diagnosing a genuine product of a battery according to Embodiment 2.

FIG. 10 is a graph for illustrating a method for diagnosing a genuine product of the battery 41 according to Embodiment 2. In Embodiment 2, determination is made on whether the rate of change (slope of the tangent line) of the voltage change curve L1 at a predetermined timing is within a predetermined reference range based on the normal curve. More specifically, at least one slope of the tangent line during the discharging period and at least one slope of the tangent line during the pause period are used. In the example shown in FIG. 10, determination is made on whether a slope SL1 of a tangent line T1 at time t31 during the discharging period is within a first reference range (not shown), and determination is made on whether a slope SL2 of a tangent line T2 at time t41 during the pause period is within a second reference range (not shown).

Figure 11:
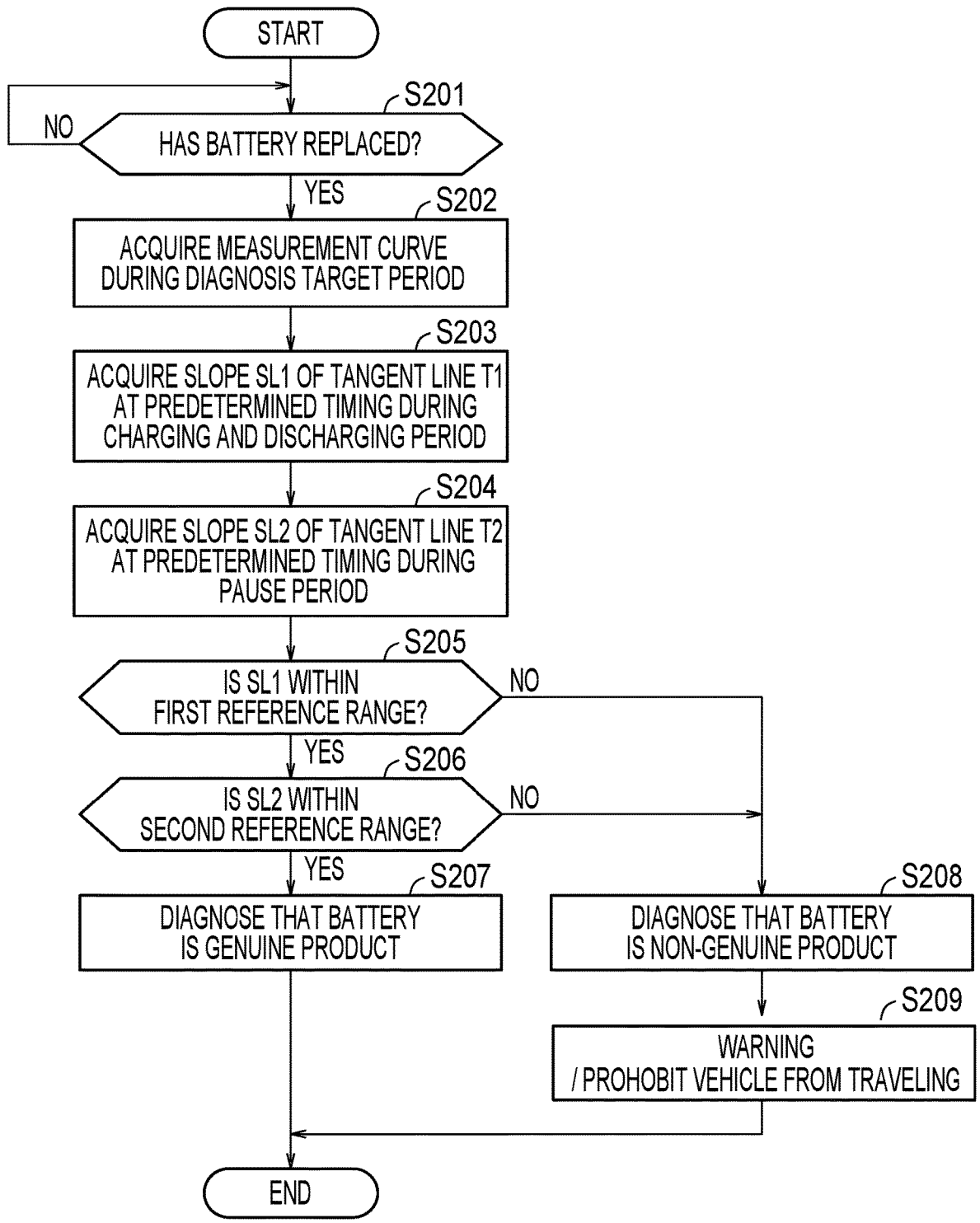
FIG. 11 is a flowchart showing battery diagnosis processing according to Embodiment 2.

FIG. 11 is a flowchart showing battery diagnosis processing according to Embodiment 2. The flowchart is the same as the flowchart in Embodiment 1 (see FIG. 9) except that the slopes SL1 and SL2 of the tangent lines are used instead of the voltages V1 and V2. Therefore, detailed description will not be repeated.

As described above, in Embodiment 2, diagnosis is made on whether the battery 41 is a genuine product based on the rate of change (slope of the tangent line) of the voltage change curve (time-series data of the voltage V) measured by voltage sensor 421 during the diagnosis target period including both the charging and discharging period and the pause period. Since diagnosis is executed based on the rate of change in both the charging and discharging period and the pause period, the difference in specifications of the battery 41 can be accurately detected as in Embodiment 1. Therefore, according to Embodiment 2, diagnosis can be made with high precision whether the battery 41 is a genuine product.

Embodiment 3

In Embodiment 3, an example will be described in which diagnosis is executed in consideration of noise generated by electronic apparatuses around the battery pack 40. The configuration of the vehicle according to Embodiment 3 is the same as the configuration of the vehicle 1 according to Embodiment 1 and Embodiment 2 (see FIGS. 1 to 3), and thus description thereof will not be repeated.

Figure 12:
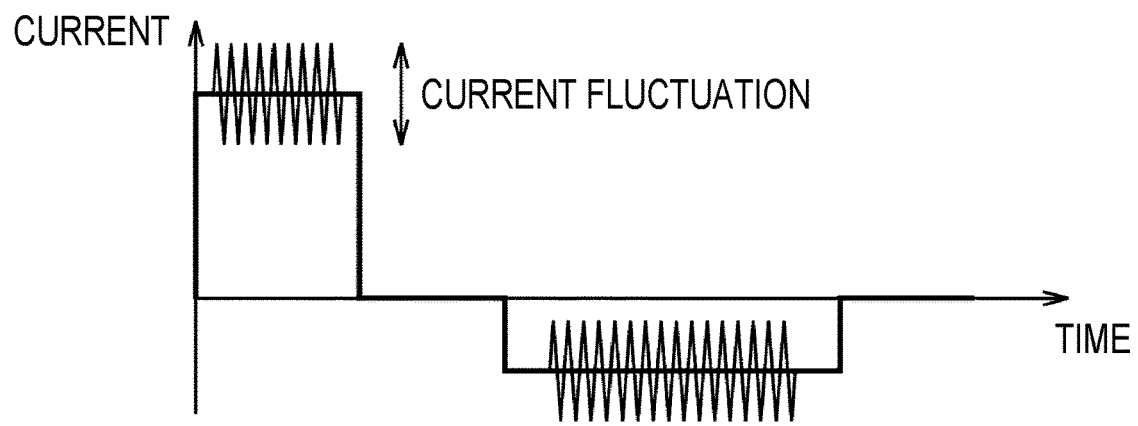
FIG. 12 is a conceptual graph for illustrating noise.

FIG. 12 is a conceptual graph for illustrating noise. The horizontal axis represents time. The vertical axis represents current. Various electronic apparatuses may exist around the battery pack 40. In the vehicle configuration of FIG. 1, the PCU 51 (inverter and/or converter), the charging device 92, and the like exist around the battery pack 40. Noise generated by the electronic apparatuses (or the power supply of the electronic apparatuses) can intermittently be superimposed on the current (detection result of the current sensor 422) as shown in FIG. 12. Noise can also be superimposed on the voltage (detection result of the voltage sensor 421). The phenomenon is hereinafter referred to as "noise interference".

Figure 13:
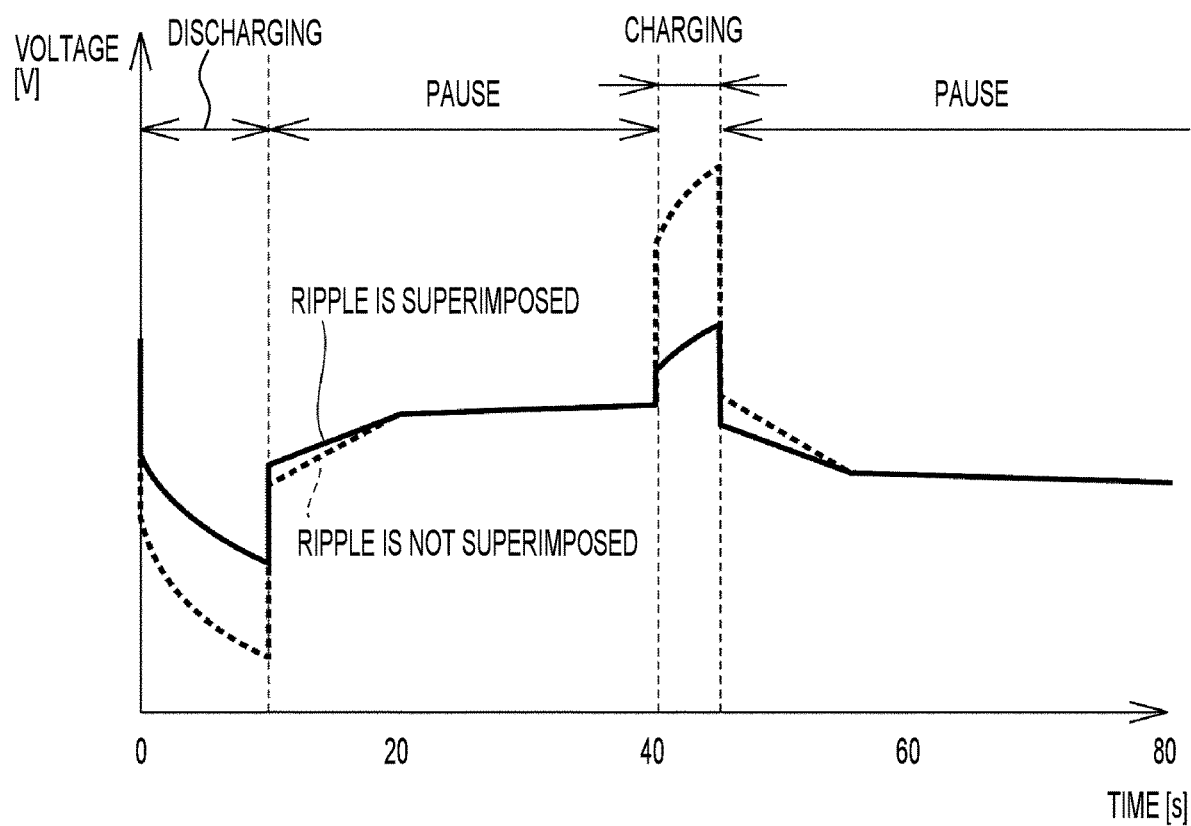
FIG. 13 is a graph for illustrating an influence of noise interference on a voltage change curve.

FIG. 13 is a graph for illustrating an influence of noise interference on a voltage change curve. FIG. 13 shows a voltage change curve when noise interference occurs and a voltage change curve when noise interference does not occur in comparison. As is clear from FIG. 13, when noise interference occurs, the shape of the voltage change curve can change. Although not shown, the shape of the normal curve may also vary. Accordingly, there is a possibility that the precision of diagnosing whether the battery 41 is a genuine product is lowered.

Therefore, in the present embodiment, a normal curve is prepared in advance assuming noise interference that may occur in the vehicle 1. That is, a ripple current generating circuit (not shown) is used in advance to generate various ripple currents simulating noise interference, and the ripple currents are applied to a genuine product. Numerous normal curves are generated by simulating noise interference under various conditions including at the time of charging and discharging and at the time of pausing. The created normal curve is stored in the memory 432 of the battery ECU 43.

Figure 14:
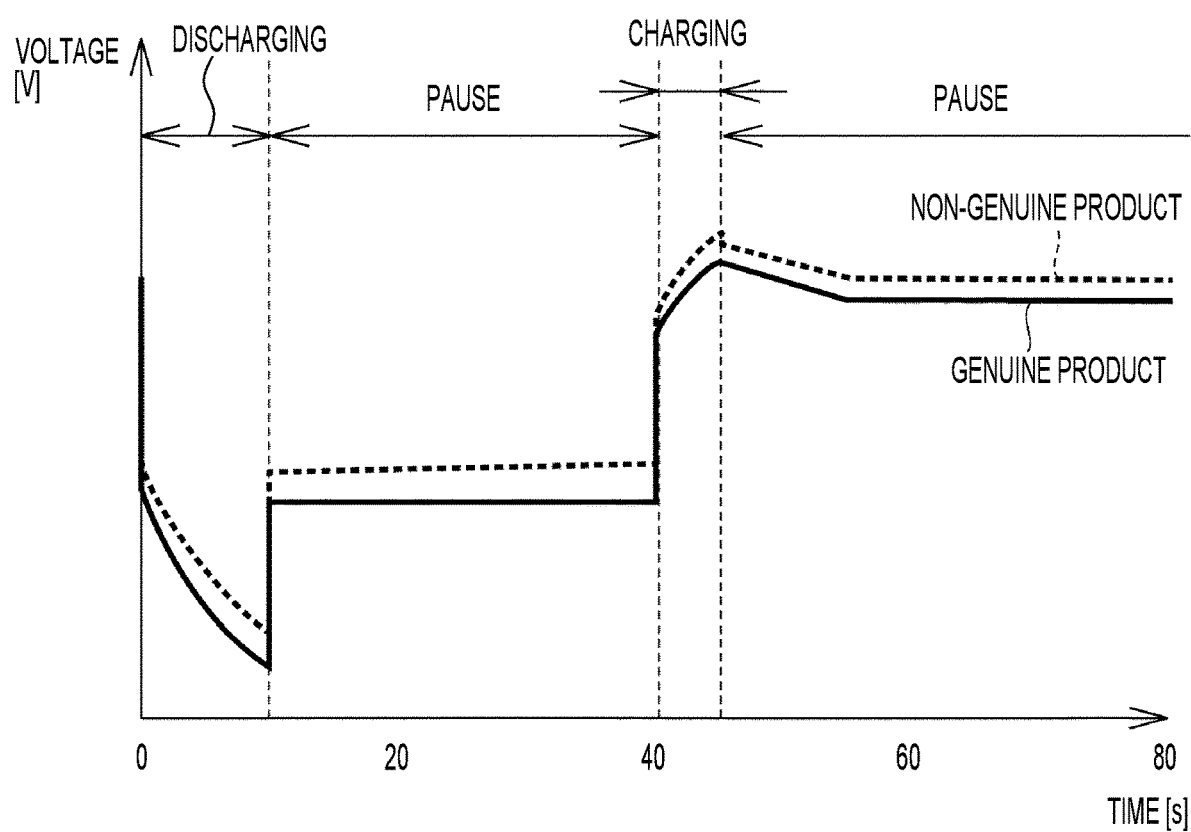
FIG. 14 is a graph showing a normal curve and a voltage change curve of a non-genuine product when noise interference occurs.

FIG. 14 is a graph showing a normal curve and a voltage change curve of a non-genuine product when noise interference occurs. As shown in FIG. 14, although noise interference occurs, the shape of the voltage change curve differs between the genuine product and the non-genuine product of the battery 41. Therefore, by comparing the voltage change curve with the normal curve, it is possible to diagnose whether the battery 41 is a genuine product or a non-genuine product.

Figure 15:
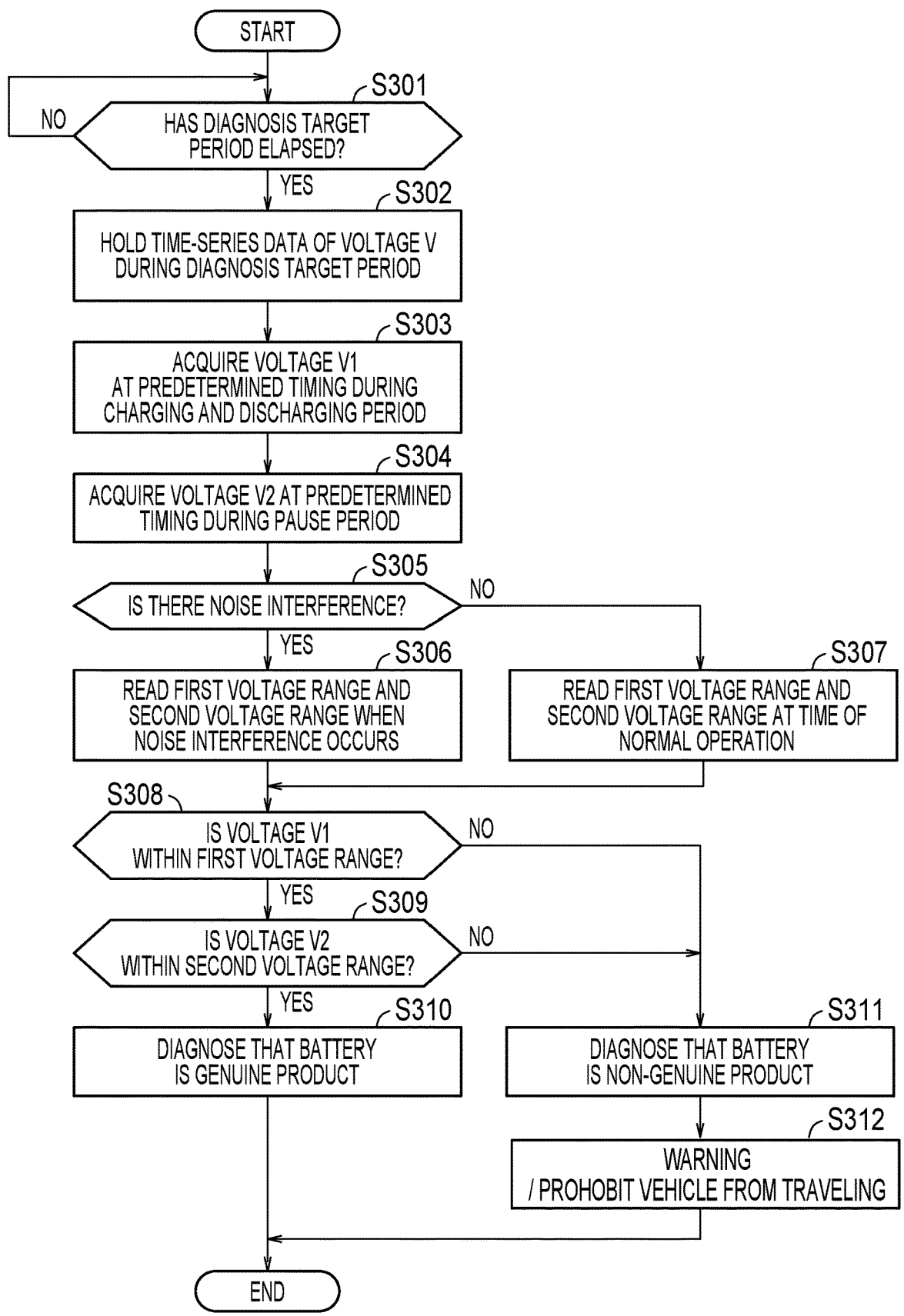
FIG. 15 is a flowchart showing battery diagnosis processing according to Embodiment 3.

FIG. 15 is a flowchart showing battery diagnosis processing according to Embodiment 3. The processing of S301 to S304 is the same as the processing of S101 to S104 in Embodiment 1 (see FIG. 9).

In S305, the battery ECU 43 determines whether noise interference occurs. The battery ECU 43, for example, can determine whether noise interference has occurred based on whether noise is superimposed on the voltage V detected by the voltage sensor 421 or the current I detected by the current sensor 422 (whether the amplitude of the noise is greater than a predetermined amount, whether the superimposition time of the noise is longer than a predetermined time, and the like).

When noise interference has occurred (YES in S305), the battery ECU 43 reads from memory 432 the first voltage range and the second voltage range set from the normal curve under the environment simulating noise interference (S306). On the other hand, when noise interference has not occurred (NO in S305), the battery ECU 43 reads from the memory 432 the first voltage range and the second voltage range set from the normal curve for normal operation (the normal curve when noise interference does not occur, which is the same as in Embodiment 1) (S307). Since the processing after S308 is the same as the processing after S105 in Embodiment 1, the description will not be repeated.

Here, an example has been described in which diagnosis is executed based on the voltage value on the voltage change curve as in Embodiment 1. However, as in Embodiment 2, diagnosis may be executed based on the rate of change in the voltage change curve (the slope of the tangent line).

As described above, according to Embodiment 3, since diagnosis is executed based on the voltage in both the charging and discharging period and the pause period as in Embodiment 1 and Embodiment 2, the difference in specifications of the battery 41 can be accurately detected. Therefore, it is possible to diagnose whether the battery 41 is a genuine product with high precision. Furthermore, in Embodiment 3, the voltage range used for diagnosing whether the battery 41 is a genuine product (the first voltage range and the second voltage range in the processing of S308 and S309) is switched between when noise interference occurs and when noise interference does not occur (normal time). By using the normal curve created under the environment simulating noise interference when noise interference occurs, it is possible to diagnose whether the battery 41 is a genuine product with high precision although noise interference occurs.

The embodiments disclosed in the present disclosure should be considered to be exemplary and not restrictive in any respects. The scope of the present disclosure is set forth by the claims rather than the description of the present embodiments, and is intended to include all modifications within the meaning and scope of the claims.

What is claimed is:

1. A battery diagnosis system comprising:
   a sensor that measures a voltage of a secondary battery; and
   a processor configured to diagnose whether the secondary battery is a genuine product based on a voltage curve indicating a time change of a voltage measured by the sensor during a diagnosis target period, the diagnosis target period including both a charging and discharging period and a charging and discharging pause period; and
   when the secondary battery is diagnosed not to be a genuine product, to display a warning message on a display device of the battery diagnosis system;
   wherein the processor is configured to diagnose whether the secondary battery is a genuine product based on a comparison result between the voltage curve and a normal curve, the normal curve indicates a time change of a voltage of the genuine product during the diagnosis target period; and
   wherein the processor is configured to diagnose that the secondary battery is a genuine product, when a rate of change on the voltage curve at a first timing during the charging and discharging period is within a first reference range and a rate of change on the voltage curve at a second timing during the charging and discharging pause period is within a second reference range, the first reference range and the second reference range are determined based on the normal curve.

2. The battery diagnosis system according to claim 1, wherein the processor is configured to diagnose that the secondary battery is a genuine product, when a voltage on the voltage curve at a first timing during the charging and discharging period is within a first voltage range and a voltage on the voltage curve at a second timing during the charging and discharging pause period is within a second voltage range, the first voltage range and the second voltage range are determined based on the normal curve.

3. The battery diagnosis system according to claim 1, wherein the processor is configured to diagnose whether the secondary battery is a genuine product based on a comparison result between the voltage curve and the normal curve, the normal curve is generated by simulating noise interference.

4. The battery diagnosis system according to claim 1, wherein the processor is configured to diagnose whether the secondary battery is a genuine product, based on a plurality of comparison results between the voltage curve and the normal curve during the charging and discharging period and a plurality of comparison results between the voltage curve and the normal curve during the charging and discharging pause period.

5. A vehicle comprising a battery diagnosis system including;
   a sensor that measures a voltage of a secondary battery; and
   a processor configured to diagnose whether the secondary battery is a genuine product based on a voltage curve indicating a time change of a voltage measured by the sensor during a diagnosis target period, the diagnosis target period including both a charging and discharging period and a charging and discharging pause period; and
   when the secondary battery is diagnosed not to be a genuine product, to display a warning message on a display device of the battery diagnosis system;
   wherein the processor is configured to diagnose whether the secondary battery is a genuine product based on a comparison result between the voltage curve and a normal curve, the normal curve indicates a time change of a voltage of the genuine product during the diagnosis target period; and
   wherein the processor is configured to diagnose that the secondary battery is a genuine product, when a rate of change on the voltage curve at a first timing during the charging and discharging period is within a first reference range and a rate of change on the voltage curve at a second timing during the charging and discharging pause period is within a second reference range, the first reference range and the second reference range are determined based on the normal curve.

6. A battery diagnosis method, comprising:
   acquiring, by a computer, a voltage curve indicating a time change of a voltage of a secondary battery measured by a sensor during a diagnosis target period, the diagnosis target period including both a charging and discharging period and a charging and discharging pause period; and
   diagnosing, by the computer, whether the secondary battery is a genuine product based on the voltage curve; and
   when the secondary battery is diagnosed not to be a genuine product, to display a warning message on a display device;
   wherein the processor is configured to diagnose whether the secondary battery is a genuine product based on a comparison result between the voltage curve and a normal curve, the normal curve indicates a time change of a voltage of the genuine product during the diagnosis target period; and
   wherein the processor is configured to diagnose that the secondary battery is a genuine product, when a rate of change on the voltage curve at a first timing during the charging and discharging period is within a first reference range and a rate of change on the voltage curve at a second timing during the charging and discharging pause period is within a second reference range, the first reference range and the second reference range are determined based on the normal curve.

* * * * *